United States Patent [19]
Basol

[11] Patent Number: 4,595,790
[45] Date of Patent: Jun. 17, 1986

[54] METHOD OF MAKING CURRENT COLLECTOR GRID AND MATERIALS THEREFOR

[75] Inventor: Bulent M. Basol, Los Angeles, Calif.

[73] Assignees: Sohio Commercial Development Co., Cleveland, Ohio; BP Photovoltaics, Ltd., London, England

[21] Appl. No.: 687,079

[22] Filed: Dec. 28, 1984

[51] Int. Cl.[4] ............... H01L 31/06; H01L 31/18
[52] U.S. Cl. ............................. 136/256; 136/260; 29/572; 29/580; 29/583; 29/591; 357/30; 357/65; 357/68; 427/74; 427/76; 427/88
[58] Field of Search ............... 136/256, 260, 264, 265; 357/16, 30, 65, 68; 29/572, 580, 583, 591; 427/74, 75, 76, 88

[56] References Cited

U.S. PATENT DOCUMENTS

| | | | |
|---|---|---|---|
| 3,112,230 | 11/1963 | Rudenberg | 136/256 |
| 3,880,633 | 4/1975 | Jordan et al. | 65/60.2 |
| 3,902,920 | 9/1975 | Jordan et al. | 136/258 |
| 4,403,398 | 9/1983 | Laurie et al. | 29/572 |

FOREIGN PATENT DOCUMENTS 55-63885  5/1980  Japan ..................... 136/260

*Primary Examiner*—Aaron Weisstuch
*Attorney, Agent, or Firm*—Thomas P. Schur; Joseph G. Curatolo; Larry W. Evans

[57] ABSTRACT

A large area photovoltaic device having a transparent front contact is made more efficient by a current collector grid formed over the transparent front contact to decrease the series resistance of the device. Where the front contact is between a transparent substrate and the semiconductor layers of the photovoltaic device, the collector grid is embedded in the semiconductor layers. To prevent leakage of current into the collector grid from one semiconductor layer, the collector grid material is selected to form a Schottky barrier junction with that semiconductor layer that blocks the flow of the leakage current. The process for preparing such thin film photovoltaic devices includes etching channels in the semiconductor layers, depositing the collector grid material in the channels, insulating the grid, and depositing a back electrical contact film. This process has several advantages, particularly when those materials for the collector grid are not compatible with the deposition processes of the semiconductor layers.

23 Claims, 6 Drawing Figures

"4,595,790"

METHOD OF MAKING CURRENT COLLECTOR GRID AND MATERIALS THEREFOR

FIELD OF THE INVENTION

This invention relates to a method and materials for forming a front contact current collector grid for a photovoltaic device. More specifically, the invention relates to a method of forming a front contact current collector grid for a thin-film photovoltaic device wherein the thickness of the current collector exceeds the thickness of the first semiconductor layer, and to preferred current collector grid compositions.

BACKGROUND OF THE INVENTION

Photovoltaic devices utilize specific conductivity characteristics of materials generally referred to as semiconductors, whereby solar energy or radiation is converted to useful electrical energy. This conversion results from the absorption of photon energy in the active region of the cell, whereby some of the absorbed energy causes the generation of electron-hole pairs. The energy required for the generation of electron-hole pairs in a semiconductor material is referred to as the band gap energy and generally is the minimum energy required to excite an electron from the valence band to the conduction band.

There are two principal measures of the utility of photovoltaic devices. First is the efficiency of the device, which is an ascertainable percentage of the total photon energy converted to useful electrical energy. High efficiency photovoltaic devices made of crystalline materials maximize efficiency by minimizing internal lattice defects. The second measure of the utility of a photovoltaic device is its cost. Single crystal devices are complex and costly to produce, and do not readily lend themselves to high volume production.

One approach to reducing the cost of photovoltaic devices is to utilize polycrystalline thin film materials and a heterojunction. A heterojunction refers to the active junction formed at the interface between two dissimilar materials, such as cadmium sulfide and cadmium telluride, as taught by Basol, et al. in U.S. Pat. No. 4,388,483. Basol, et al. described thin-film heterojunction photovoltaic cells wherein the active layer comprises at least one of the metal elements of Class IIB of the Periodic Table of Elements and one of the nonmetal elements of Class VIA of the Periodic Table of Elements. One feature of such photovoltaic devices is the use of extremely thin active layers. As an example, Basol, et al. utilized a cadmium sulfide layer on the order of 0.02–0.05 micrometers and a cadmium telluride layer on the order of about 1.3 micrometers. While such economy of material has obvious advantages, it has also presented an unexpected concern with respect to current collection.

Such thin-film photovoltaic devices typically comprise an optically transparent substrate, a first semiconductor layer formed on the transparent substrate, a second semiconductor layer of opposite conductivity type than the first semiconductor layer forming a junction with the first layer, and a back contact comprised of a conductive film. When the substrate is not electrically conductive, there is disposed between the substrate and the first semiconductor layer a front contact which is a transparent conductive layer, such as a transparent conductive oxide. This layer functions as a current collector for the photovoltaic device. Transparent conductive oxides, such as indium tin oxide, indium oxide, tin oxide, and zinc oxide are not efficient current collectors in cells of any appreciable size, that is greater than about one square centimeter, due to their inherent sheet resistivity of about 10 ohms per square. The transparent conductive layer must be supplemented with more efficient current collection means. Formation of front contact current collector means for thin-film photovoltaic devices presents novel concerns as the general thickness of a front contact grid-type current collector disposed in contact with the transparent conductive layer typically exceeds the combined thickness of the first semiconductor layer and extends into the second active layer. This geometry creates problems with respect to shorting of the device and to uniform formation of the semiconductor layers themselves.

It is one object of the present invention to provide a front contact current collector grid for photovoltaic devices, wherein the thickness of the current collector grid exceeds the thickness of the first semiconductor layer, which does not suffer from the above-identified shortcomings.

It is another object of the present invention to provide materials suitable for use as current collector grids in photovoltaic device wherein the thickness of the current collector grid exceeds the thickness of the first semiconductor layer.

It is yet another object of the present invention to provide a method for the formation of a current collector grid in a photovoltaic device, which grid has a thickness exceeding the thickness of the first semiconductor layer.

These and additional objects of the present invention will become apparent to one skilled in the art from the below description of the invention and the appended claims.

SUMMARY OF THE INVENTION

In general, the invention relates to a thin-film photovoltaic device comprising a transparent substrate, a conductive transparent film disposed on the substrate, a first semiconductor layer formed on the conductive transparent film, a second semiconductor layer of opposite conductivity type than the first semiconductor layer deposited contiguously onto the first semiconductor layer and forming a function therewith, a conductive film disposed over the second semiconductor layer to form a back electrical contact, and a current collector grid in ohmic contact with the first semiconductor layer and extending through the first semiconductor layer, the current collector grid forming a blocking contact between the grid and the second semiconductor layer; the grid being in ohmic contact with the first semiconductor layer and the back electrical contact being in ohmic contact with the second semiconductor layer. These thin-film photovoltaic devices are often characterized by having a front contact current collector grid thickness that exceeds the combined thicknesses of the first and second semiconductor layers, under which circumstances a layer of electrically insulating material is disposed between the collector grid and the back electrical contact.

The invention also relates to a front contact current collector grid in physical contact with the first and second semiconductor layers, the semiconductor layers having opposite conductivity types, which grid forms an ohmic contact with the first semiconductor layer and a current blocking contact with the second semiconductor layer. Grid compositions are disclosed that impart the electrical contact properties of such a current collector grid.

Further, the invention relates to a process of forming a photovoltaic device, which process comprises:
(a) depositing a conductive transparent film on a transparent substrate;
(b) depositing a first semiconductor layer onto the conductive transparent film;
(c) depositing a second semiconductor layer having a conductivity type opposite from the first semiconductor, onto the first semiconductor layer;
(d) etching channels through the first and second semiconductor layers;
(e) depositing electrically conductive material into the channels to form a current collector grid, the electrically conductive material being selected so as to form a blocking junction with the second semiconductor layer;
(f) depositing an electrically insulating material on the current collector grid; and
(g) depositing an electrically conductive film over the second semiconductor layer and insulated current collector grid to provide an ohmic contact with the second semiconductor layer.

DETAILED DESCRIPTION OF THE INVENTION

As used herein, reference is made to large-area, thin-film photovoltaic devices. Such photovoltaic devices are characterized in having an exposed active surface area of at least one square centimeter, combined semiconductor layer thicknesses of less than about 2 micrometers, and comprising semiconductor layers of opposite conductivity types. Examples of combinations of such semiconductor layers include CdTe/CdS, HgCdTe/CdS, Cu$_2$S/CdS, CuInSe$_2$/CdS, ZnTe/CdS, and ZnTe/CdSe. Preferably, the semiconductor layers comprise at least one of the metal elements of Class IIB and one of the non-metal elements of Class VIA of the Periodic Table of Elements, such as CdS, CdTe, and HgCdTe.

While the invention will be described below as utilizing cadmium sulfide and cadmium telluride semiconductor layers, such embodiment is not to be regarded as limitative. The invention can be utilized in any semiconductor device wherein a current collector grid is utilized for a front contact and wherein the thickness of the grid exceeds the thickness of the first semiconductor layer.

U.S. Pat. No. 4,388,483 to Basol, et al. incorporated herein by reference, teaches a thin-film photovoltaic device having an n-type semiconductor layer of cadmium sulfide and a p-type semiconductor layer of cadmium telluride. Light enters such a cell through a transparent substrate and passes there through into a cadmium sulfide layer, then into a cadmium telluride layer. Since the cadmium sulfide layer attenuates light reaching the cadmium sulfide/cadmium telluride heterojunction, it is desirable to provide a very thin cadmium sulfide layer, in the range from about 0.01 micrometers to about 0.1 micrometers in thickness. The cadium telluride layer is an efficient absorber of light and does not require a thickness of more than about 1.2 micrometers to effectively utilize about all of the usable solar spectra which enters.

The cadmium sulfide layer is contiguous to a layer of an optically transparent, electrically conductive material such as indium tin oxide that is disposed between the cadmium sulfide layer and the transparent substrate. To enhance the current collection of the indium tin oxide layer, a current collector grid is utilized. This front contact current collector grid may have any geometry that allows efficient current collection. Preferably the grid comprises narrow strips so as to permit the maximum amount of solar radiation to enter the cell. Because the grid is narrow, each strip has a relatively large thickness so that the grid has a low resistivity compared to the conductive, transparent layer. The typical thickness of such a grid is generally from about 2 micrometers to about 10 micrometers, depending on the material used for the grid and the width of the grid. Thus, it is seen that the thickness of the grid exceeds the thickness of the first semiconductor layer and generally exceeds the combined thicknesses of the first and second semiconductors layers.

As now becomes apparent, this physical arrangement is operable only so long as the current collector grid does not shunt current from the cadmium telluride layer. The grid may permit excessive leakage current to pass through a junction between the cadmium telluride layer and the collector grid, leakage current being defined as the current able to pass from the back electrical contact through the cadmium telluride film and to the front contact current collector. The magnitude of this leakage current depends on the resistivity of the cadmium telluride, the distance between the edge of the back electrical contact and the collector grid, and the method of preparing and composition of the collector grid. Such a leakage current reduces the overall efficiency of the photovoltaic device if a low resistivity second semiconductor layer, such as a low resistivity layer of cadmium telluride, is employed, and/or if the distance between the back and the front current collectors that leakage current must traverse is very small.

The leakage current through the junction may be reduced by selecting the composition of the collector grid such that the collector grid/cadmium telluride contact becomes a blocking junction. This would reduce the leakage current to the point where it does not significantly affect the overall efficiency of the photoresponsive device. Known collector grid materials possessing low resistivity may not perform well in such thin photovoltaic devices. These materials, such as copper, gold, and silver form ohmic electrical contacts with both cadmium sulfide and cadmium telluride and so open pathways for leakage current through such a photovoltaic device. These materials diffuse rapidly into a Class IIB-VIA semiconductor such as cadmium telluride at the temperatures that are necessary to deposit the materials as current collectors. For example, a substrate temperature of between about 150° C. and 200° C. is preferable to form a mechanically stable contact when a copper or silver grid is evaporated thereon. Materials that form a blocking junction with a p-type semiconductor material such as cadmium telluride include aluminum, indium, cadmium, tin, lead, zinc, and mixtures and alloys thereof. Preferably a front contact current collector grid composition is aluminum.

In accordance with the present invention, there is also provided a method for the formation of a front contact current collector grid. Generally, such a current collector grid is deposited onto a transparent, conductive layer and followed by subsequent depositions of the active semiconductor layers. This procedure has several drawbacks when applied to the formation of a front contact current collector grid for a photovoltaic device when the thickness of the grid exceeds the thickness of the first semiconductor layer.

A first concern relates to diffusion of the grid material into the semiconductor layers at elevated processing temperatures either during the formation of the semiconductor layers or later in subsequent device processing. If the semiconductor layers are electrodeposited in a bath, the bath solution may dissolve the grid material, adversely affecting the grid and the semiconductor layers being formed. In the latter instance, the grid may be deteriorated and the bath may become contaminated with leached grid material, adversely affecting the deposited semiconductor layer. In the electrodeposition process taught in U.S. Pat. No. 4,388,483, copper, gold, silver, and nickel and the like are identified as grid materials that withstand attack in the electrolytic baths chosen for the deposition of cadmium sulfide and cadmium telluride semiconductor layers. However, these materials also form good electrical contacts with both the cadmium sulfide and the cadmium telluride layers and are susceptible to producing high leakage current paths between the cadmium telluride layer and the grid as discussed herein above. Aluminum, indium, cadmium, tin, lead and the like, described above as preferred grid materials because they form a current blocking barrier with p-type semiconductors such as cadmium telluride, quickly dissolve in plating baths, introducing impurities, and so are not suitable compositions for current collector grids formed in accordance with prior art methods.

A second concern arises with regards to the deposition of semiconductor layers subsequent to the formation of the current collector grid. The deposition may not be uniform or complete due to the presence of the current collector grid, which has a relatively large thickness, disposed on the transparent conductive layer. It has been seen that the deposition of cadmium sulfide and cadmium telluride layers near such a grid is imperfect, often leaving exposed portions of the transparent conductive layer that are susceptible to etching and eroding during subsequent electrodeposition steps, such as during electroplating of cadmium telluride in an acidic bath solution. Under such circumstances, the grid is either electrically insulated from the semiconductor layers or electrically separated from them by a high resistance and cannot be an effective current collector. This has the adverse result of increasing the series resistance of the photovoltaic device, and may cause ultimate failure of such a device.

The above difficulties may be overcome by following the method in accordance with this invention, whereby the current collector grid is deposited after formation of the active semiconductor layers. In this method the semiconductor layers are first deposited onto a transparent conductive layer, after which channels are etched, scribed or otherwise formed through the semiconductor layers in a pattern desired for the current collector grid. The etching may be chemical etching and the scribing may be physical, mechanical, laser-scribing or other known means. An electrically conductive material is then deposited into the channels, the electrically conductive material being selected so as to form a current blocking junction with the second semiconductor layer. These materials have been identified above. An electrically insulating material may then be selectively deposited over the grid. An electrically conductive film may then be disposed as a back contact to the photovoltaic device, contacting the second semiconductor layer and being insulated from the current collector grid.

By this method continuous and uniform semiconductor layers may be deposited on a substrate that has been first coated with a transparent conductive film. Since the deposition of the collector grid occurs after the formation of the semiconductor layers, any necessary heat treating of the semiconductor layers will occur without the presence of the collector grid material, eliminating any diffusion of the grid material into the active semiconductor layers during formation of such semiconductor layers. Additionally, this method permits use of grid materials that are not compatible with preferred processes for the deposition of the semiconductor layers. As an example, aluminum, which dissolves in cadmium telluride plating solution, may be used as the grid material in a cadmium sulfide/cadmium telluride photovoltaic device, the semiconductor layers having been formed before aluminum is deposited in the grid channels. In this manner, aluminum, which forms a low-cost, current blocking barrier to cadmium telluride may be used as a front contact current collector grid without suffering the detriments that occur by prior art grid deposition methods.

The following drawings and examples demonstrate the effectiveness of the subject invention. It is to be understood that these drawings and examples are utilized for illustrative purposes only, and are not intended, in any way, to be limitative of the present invention.

DETAILED DESCRIPTION OF THE DRAWINGS

Figure 1:
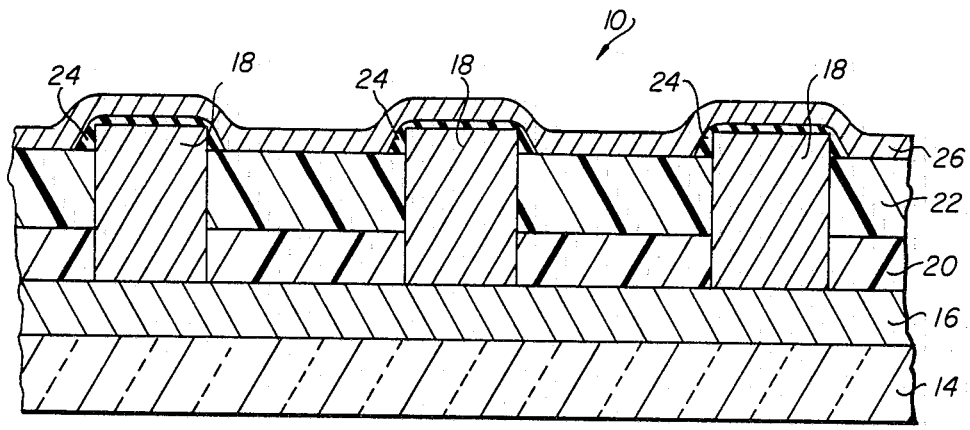
FIG. 1 is a cross-sectional view of a photovoltaic device in accordance with the present invention wherein a front contact current collector grid is incorporated therein.

As shown in FIG. 1, a preferred embodiment of a photovoltaic device in accordance with the present invention shown generally by reference numeral 10, comprises a transparent substrate 14, such as glass, through which light, generally identified by arrows 12, enters the device. A layer of an optically transparent, electrically conductive material 16 is deposited onto the substrate 14 and is contiguous thereto. Current collector grid 18 is shown in touching contact with the transparent conductive layer 16. Between segments of the current collector grid 18 is a first semiconductor layer 20 disposed on the transparent conductive layer 16 and a second semiconductor layer 22 disposed on the first semiconductor layer. The current collector grid 18 may alteratively be in touching contact with, that is terminating within. The first semiconductor layer 20 if the first semiconductor layer has a sufficiently low resistivity.

The conductivity types of semiconductor layers 20 and 22 are not the same. As an example, the first semiconductor layer 20 may be an n-type semiconductor layer of cadmium sulfide and the second semiconductor layer 22 may be a p-type semiconductor layer of cadmium telluride. The thickess of the current collector grid is shown to exceed the combined thicknesses of the first and second semiconductor layers.

It is to be noted herein, and appreciated by those skilled in the art, that the dimensions of the various features of the figures depicted are not drawn to scale with respect to each individual feature. A typical thin-film photovoltaic device may contain active semiconductor layers having combined thicknesses in the range of from about 1 micrometer to about 10 micrometers and utilize a current collector grid having a thickness of from about 1 micrometer to about 10 micrometers. It is appreciated that the features in the drawings are depicted for purposes of clarifying the subject invention.

An insulating film 24 is deposited over the grid lines so as to insure that the front contact 16 and the current collector grid 18 are not shorted to the back contact 26. Because the current collector grid is in contact with the transparent conductive layer 16, the first semiconductor layer 20 and the second semiconductor layer 22, it is important that the grid 18 comprises a composition identified herein as one that forms an efficient electrical contact with the transparent conductive layer 16 and the first semiconductor layer 20 but a blocking barrier to the second semiconductor layer 22. The back contact 26 is in electrical contact with the second semiconductor layer 22 and comprises a material that is an efficient current collector at that interface. Various arrangements of back contact current collection means are known and may be utilized in a photovoltaic cell in accordance with the present invention.

Figure 2:
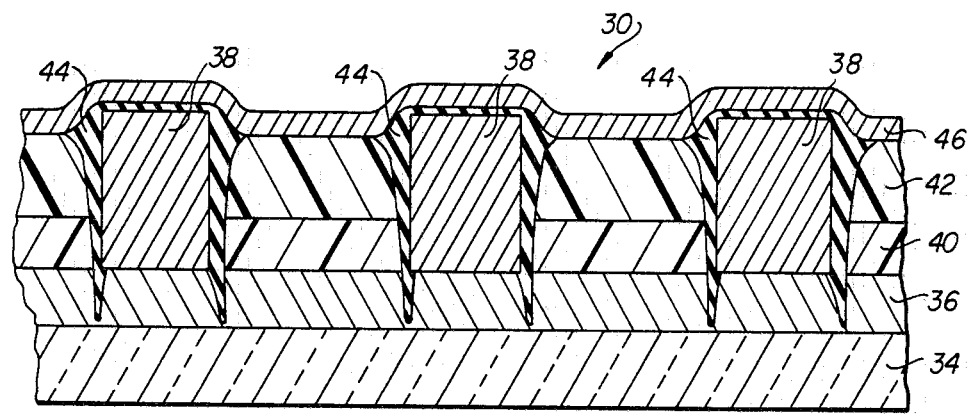
FIG. 2 is a cross-sectional view of a photovoltaic device showing imperfect deposition of the semiconductor layers at the edges of the current collector grid, the semiconductor layers having been deposited after the grid was formed.

FIG. 2 shows a cross-sectional view of a photovoltaic device utilizing a front contact current collector grid but made not in accordance with the present invention. As can be seen, the photovoltaic device generally referred to by reference number 30 comprises a transparent substrate 34 through which radiant energy indicated by arrows 32 enters the photovoltaic device. An optically transparent, electrically conductive material 36 is deposited on the substrate 34. When next there is deposited the front contact current collector grid 38, subsequent formation of the active semiconductor layers may not result in layers that extend completely between the grid lines. As shown in FIG. 2, the first semiconductor layer 40 and second semiconductor layer 42 may not be deposited in such a manner that they fully contact the current collector grid 38. If the semiconductor layers are deposited by electrodeposition, as in accordance with U.S. Pat. No. 4,388,483 to Basol, et al., the plating baths and any etching steps therebetween may partially leach the grid material and/or etch into the transparent conductive layer 36. Thus, the grid finger may be electrically isolated from both semiconductor layers, defeating its purpose and use. Insulating material 44 is shown disposed between the current collector grid 38 and semiconductor layers 40 and 42 as well as partially disposed into the transparent conductive layer 36 that may be etched during the electrodeposition of the semiconductor layers if not covered by such semiconductor material.

A back electrical contact 46 is also shown in contact with the second semiconductor layer 42 and the insulating material 44. This figure demonstrates the obvious perils associated with the formation of a photovoltaic device utilizing a front contact current collector grid.

Figure 3A:
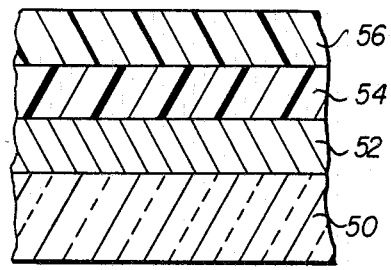
FIGS. 3A–D are cross-sectional views of a photovolatic device showing the stepwise formation of a front contact current collector grid in accordance with the present invention.
Figure 3B:
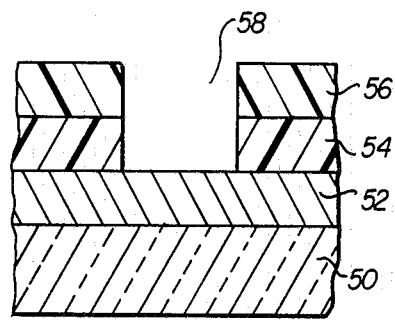
Figure 3C:
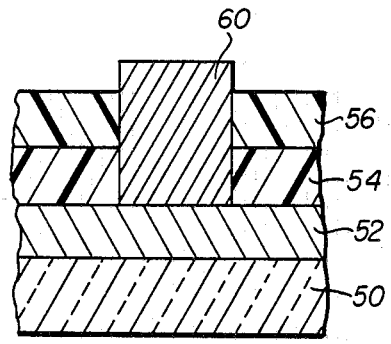
Figure 3D:
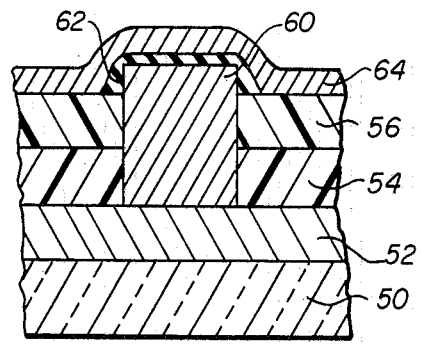

The method of forming a front contact current collector grid in accordance with the present invention avoids the perils depicted in FIG. 2, and is exemplified in FIGS. 3A–D. As shown in FIG. 3A, this method includes the use of a transparent substrate 50 having an optically transparent, electrically conductive film 52 deposited thereon. Onto the transparent conductive film 52 is deposited a first semiconductor layer 54 and a second semiconductor layer 56. Such layers may be formed by a variety of known methods including those methods taught by Tyan in U.S. Pat. No. 4,207,119 entitled "Polycrystalline Thin Film CdS/CdTe Photovoltaic Cell" and Uda, et al. "All-Screen Printed CdS/CdTe Cell", 16th *IEEE Photovoltaic Specialists Conference*, page 801, 1982. Next, as shown in FIG. 3B, channels 58 are formed through the first and second semiconductor layers, 54 and 56 respectively, to expose the transparent conductive layer 52. Alternative embodiments would require that the channel extend only through the second semiconductor layer through the second semiconductor layers and partially into the first semiconductor layer, or that the channel extend into the transparent conductive layer, the object being to achieve electrical contact between the grid to be formed in the channel and the transparent, conductive layer. Once channels have been formed in the photovoltaic device in the pattern desired for the front current collector grid, the current collector grid is formed by depositing a conductive material in the channels. Deposition of the grid may occur by any known process, as by vapor deposition or electrodeposition; the optimum deposition process being determined predominately by the particular semiconductor layers present and the grid material to be deposited. Material may be deposited effectively only in the channels by vapor deposition or electrodeposition wherein the remaining portion of the exposed surface of the second semiconductor layer has been masked to prevent deposition thereon. The so-formed current collector grid 60 has a thickness dependent upon the overall required resistivity for the grid. The current collector grid generally has a thickness that exceeds the thickness of the first semiconductor layer and generally exceeds the combined thickness of the first and second semiconductor layers, as is depicted in FIG. 3C. After the deposition of the current collector grid, the grid is covered with an electrically insulating material 62 as shown in FIG. 3D. Such insulating materials are well-known to one skilled in the art. This insulating material electrically isolates the current collector grid 60 from the back electrical contact 64 that is formed to be preferably an ohmic contact with the second semiconductor layer 56.

EXAMPLES

Two photovoltaic devices were made to demonstrate the effectiveness of the current collector grids in accordance with this invention. Large area, approximately two centimeters by two centimeters solar cells, similar to the photovoltaic device depicted in FIG. 1 were prepared using the method exemplified in FIGS. 3A–D. The photovoltaic devices utilized a glass substrate coated on one side with a layer of indium tin oxide, an optically transparent, electrically conductive material.

Onto the indium tin oxide layer was electrodeposited a layer of cadmium sulfide, having a thickness of about 0.06 micrometers and a layer of cadmium telluride, having a thickness of about 1.2 micrometers. These semiconductor layers were deposited in accordance with the method taught and claimed in U.S. Pat. No. 4,388,483.

A shadow mask having the current collector grid pattern was registered on the surface of the cadmium telluride layer. The pattern comprised strips, or fingers, about 0.05 cm. wide and spaced about 0.7 cm. apart. This pattern was physically scribed through the cadmium telluride and cadmium sulfide layers to form channels and to expose the indium tin oxide layer. These channels defined the pattern of the desired current collector grid.

In the first photovoltaic device, silver was vapor deposited into the channels to form the front contact current collector grid at a substrate temperature of about 150° C. The silver grid had a thickness of about 4 micrometers. An electrically insulating material was then used to coat the exposed portions of the current collector grid. A back electrical contact of gold was then vapor deposited over the exposed cadmium telluride layer and the insulated current collector grid to complete the solar cell. It is known that silver makes good ohmic contact with cadmium sulfide as well as cadmium telluride and that silver diffuses quickly into cadmium telluride. Thus, this current collector grid provided a high leakage current through the junction between the cadmium telluride layer and the silver current collector. The device exhibited very low open circuit voltage, $V_{oc}$ of about 0.4 volt. The fill factor of this device was estimated to be about 0.3.

In the second photovoltaic device, aluminum was vapor deposited into the channels that had been scribed through the cadmium telluride and cadmium sulfide layers to form the front contact current collector grid at a substrate temperature of about 150° C. The aluminum grid had a thickness of about eight micrometers. The solar cell was then completed as above by depositing an electrically insulating layer over the exposed portions of the current collector grid and then vapor depositing a back electrical contact of gold onto the insulator material and the exposed portions of the cadmium telluride semiconductor layer. Aluminum forms a good ohmic contact with indium tin oxide and cadmium sulfide and is recognized to form a blocking junction with a p-type semiconductor compound such as cadmium telluride. This cell, when tested, exhibited an open circuit voltage of about 0.7 volts and a fill factor of about 0.5. The cell attained an active area efficiency of about 6.8 percent.

Inasmuch as the present invention is subject to many variations, modifications and changes of detail, a number of which have been expressly stated herein, it is intended that all matter described throughout this specification or shown in the accompanying drawings be interpreted as illustrative and not in a limiting sense. It should thus be evident that a device constructed in accordance with the concepts of the present invention or a method for the making thereof, and reasonable equivalents thereto, will accomplish the objects of the present invention. The scope of the invention shall include all modifications and variations that fall within the scope of the attached claims.

I claim:

1. A thin-film photovoltaic device comprising an optically transparent, electrically conductive substrate; a first semiconductor layer formed on the conductive transparent substrate, a second semiconductor layer of opposite conductivity type than the first semiconductor layer deposited contiguously onto the first semiconductor layer and forming a junction therewith; a conductive film disposed over the second semiconductor layer to form a back electrical contact; and a current collector grid in contact with the first semiconductor layer and extending through at least the first semiconductor layer, the current collector grid being in electrically blocking contact with the second semiconductor layer; the grid being in ohmic contact with the first semiconductor layer and the back electrical contact being in ohmic contact with the second semiconductor layer.

2. The photovoltaic device in accordance with claim 1 wherein said first semiconductor layer comprises a compound having a metal element selected from Class IIB and at least one non-metal element selected from Class VIA of the Periodic Table of the Elements.

3. The photovoltaic device in accordance with claim 1 wherein said first semiconductor layer is cadmium sulfide.

4. The photovoltaic device in accordance with claim 1 wherein said second semiconductor layer comprises a compound having a metal element selected from Class IIB and at least one non-metal element selected from Class VIA of the Periodic Table of the Elements.

5. The photovoltaic device in accordance with claim 1 wherein said second semiconductor layer is cadmium telluride.

6. The photovoltaic device in accordance with claim 1 wherein said second semiconductor layer is mercury cadmium telluride.

7. The photovoltaic device in accordance with claim 1 wherein said optically transparent, electrically conductive substrate comprises a layer of glass coated with a layer of a transparent conductive oxide.

8. The photovoltaic device in accordance with claim 7 wherein said layer of transparent conductive oxide is indium tin oxide.

9. The photovoltaic device in accordance with claim 1 wherein said current collector grid comprises aluminum, indium, cadmium, tin, lead, zinc, and mixtures and alloys thereof.

10. The photovoltaic device in accordance with claim 1 wherein said current collector grid comprises aluminum.

11. The photovoltaic device in accordance with claim 1 wherein the thickness of said current collector grid exceeds the combined thicknesses of the first and second semiconductor layers.

12. The photovoltaic device in accordance with claim 11 wherein a layer of electrically insulating material is disposed between said current collector grid and said back electrical contact.

13. The photovoltaic device in accordance with claim 1 wherein the thickness of said first semiconductor layer ranges from about 0.01 micrometers to about 0.1 micrometer.

14. The photovoltaic device in accordance with claim 1 wherein the thickness of said second semiconductor layer ranges from about 1.0 micrometer to 1.5 micrometers.

15. The photovoltaic device in accordance with claim 1 wherein the thickness of said current collector grid ranges from about 1 micrometer to about 10 micrometers.

16. A thin-film heterojunction photovoltaic device comprising a transparent substrate, a conductive transparent film disposed on said substrate, a first semiconductor layer formed on said conductive transparent film, a second semiconductor layer of opposite conductivity type than the first semiconductor layer deposited contiguously onto said first semiconductor layer and forming a junction therewith, a conductive film disposed over said second semiconductor layer to form a back electrical contact, a current collector grid in contact with and extending through both said first and second semiconductor layers, said current collector grid forming a blocking contact with said second semiconductor layer, and a layer of electrically insulating material disposed between said collector grid and said back electrical contact, whereby said grid is in ohmic contact with said first semiconductor layer and said back electrical contact is in ohmic contact with said second semiconductor layer.

17. A photovoltaic device having a first semiconductor layer and a second semiconductor layer of a conductivity type opposite that of the first semiconductor layer and forming a junction therewith, and a front contact current collector grid in physical contact with both said first and second semiconductor layers, said grid forming an ohmic contact with said first semiconductor layer and a current blocking contact with said second semiconductor layer.

18. The device in accordance with claim 17 wherein said grid comprises aluminum, indium, cadmium, tin, lead, zinc, and mixtures and alloys thereof.

19. The device in accordance with claim 17 wherein said grid is aluminum.

20. The device in accordance with claim 17 wherein said grid has a thickness exceeding the combined thicknesses of said first and second semiconductor layers.

21. A process of forming a photovoltaic device, which process comprises:
   (a) depositing a conductive transparent film on a transparent substrate;
   (b) depositing a first semiconductor layer onto the conductive transparent film;
   (c) depositing a second semiconductor layer having a conductivity type opposite from the first semiconductor onto the first semiconductor layer, the second semiconductor layer forming a photovoltaic junction with the first semiconductor layer;
   (d) etching channels extending through the first and second semiconductor layers;
   (e) depositing electrically conductive material into the channels to form a current collector grid, the electrically conductive material being selected so as to form an ohmic contact with the first semiconductor layer and a blocking junction with the second semiconductor layer;
   (f) depositing an electrically insulating material on the portions of the current collector grid not in contact with either the first or second semiconductor layers; and
   (g) depositing an electrically conductive film over the second semiconductor layer and insulated current collector grid to provide an ohmic contact with the second semiconductor layer.

22. The method of claim 21 wherein said electrically conductive material deposited into said channels comprises aluminum, indium, cadmium, tin, lead, zinc, and mixtures and alloys thereof.

23. The method of claim 21 wherein said electrically conductive material deposited into said channels comprises aluminum.

* * * * *